(12) United States Patent
Fujimori et al.

(10) Patent No.: US 9,497,837 B2
(45) Date of Patent: Nov. 15, 2016

(54) ELECTROSTATIC PROTECTION DEVICE

(75) Inventors: Takahiro Fujimori, Tokyo (JP); Shingo Suzuki, Tokyo (JP); Kensaku Asakura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 208 days.

(21) Appl. No.: 14/351,682

(22) PCT Filed: Sep. 13, 2012

(86) PCT No.: PCT/JP2012/073408
§ 371 (c)(1),
(2), (4) Date: Apr. 14, 2014

(87) PCT Pub. No.: WO2013/054629
PCT Pub. Date: Apr. 18, 2013

(65) Prior Publication Data
US 2014/0313633 A1 Oct. 23, 2014

(30) Foreign Application Priority Data

Oct. 14, 2011 (JP) ................................. 2011-226853
Sep. 6, 2012 (JP) ................................. 2012-196259

(51) Int. Cl.
*H05F 3/00* (2006.01)
*H05F 3/04* (2006.01)
(Continued)

(52) U.S. Cl.
CPC *H05F 3/04* (2013.01); *H01T 1/24* (2013.01); *H01T 4/12* (2013.01); *H05K 1/026* (2013.01); *H05K 2201/0175* (2013.01); *H05K 2201/0209* (2013.01); *H05K 2201/09272* (2013.01)

(58) Field of Classification Search
CPC ............ H05F 3/04; H01T 1/24; H01T 4/12; H05K 1/026
See application file for complete search history.

(56) References Cited

U.S. PATENT DOCUMENTS

| 5,336,970 A | 8/1994 | Einbinder |
| 2012/0250196 A1* | 10/2012 | Sumi et al. ..................... 361/56 |
| 2013/0201585 A1 | 8/2013 | Ikeda et al. |

FOREIGN PATENT DOCUMENTS

| EP | 1 788 680 A1 | 5/2007 |
| EP | 2 190 083 A1 | 5/2010 |

(Continued)

OTHER PUBLICATIONS

Jun. 15, 2015 Extended Search Report issued in European Application No. 12840734.3.
(Continued)

*Primary Examiner* — Thienvu Tran
*Assistant Examiner* — Tien Mai
(74) *Attorney, Agent, or Firm* — Oliff PLC

(57) ABSTRACT

An electrostatic protection device with an improved durability with repeated use and an excellent discharging property is provided. The electrostatic protection device 100 comprising an insulating laminate 11, a pair of discharge electrodes 12 and 13 inside the insulating laminate 11 and a discharge triggered part 14 disposed between these discharge electrodes and at the periphery of the end portion of the discharge electrode is configured by disposing glass-containing insulating layers 15 and 16 on the surfaces of the discharge electrodes. The flow of conductive inorganic materials in the discharge electrodes towards the discharge triggered part caused by the discharging process can be inhibited by arranging the insulating layer containing glass on the surfaces of the discharge electrodes.

15 Claims, 4 Drawing Sheets

(51) Int. Cl.
*H01T 4/12* (2006.01)
*H01T 1/24* (2006.01)
*H05K 1/02* (2006.01)

(56) References Cited

FOREIGN PATENT DOCUMENTS

| EP | 2 270 936 A1 | 1/2011 |
|---|---|---|
| JP | A-2006-49064 | 2/2006 |
| JP | A-2009-301819 | 12/2009 |
| JP | A-2011-124102 | 6/2011 |
| JP | 2011-204443 A | 10/2011 |
| WO | 2011/096335 A1 | 8/2011 |

OTHER PUBLICATIONS

International Preliminary Report on Patentability issued in International Patent Application No. PCT/JP2012/073408 dated Apr. 15, 2014 (with translation).
Written Opinion issued in International Patent Application No. PCT/JP2012/073408 dated Oct. 16, 2012 (with translation).
International Search Report issued in International Patent Application No. PCT/JP2012/073408 dated Oct. 16, 2012.

* cited by examiner

ELECTROSTATIC PROTECTION DEVICE

The present invention relates to an electrostatic protection device, especially an electrostatic protection device useful in the application of a high-speed transmission system and the integration with common mode filters.

BACKGROUND

Recently, the downsizing and performance improvement of the electric devices are under rapid development. Also, the improvement on the transmission speed and lowering driving voltage of the used circuit element are remarkable, as seen in the high-speed transmission systems such as the antenna circuit of the mobile phone, RF module, USB 2.0 and USB3.0, S-ATA2, HDMI or the like. With the downsizing of the electric devices and lowering driving voltage of the circuit element, the breakdown voltage of the electric parts which are used in the electric devices is decreased. In this respect, the protection of the electric components from overvoltage becomes an important technical subject, for example, protecting the electric components against the electrostatic pulses derived from the contact between the human body and the terminal of an electric device.

In the past, a laminated varistor is disposed between entrance line of the static electricity and the ground to protect the electric components against such electrostatic pulses. However, the laminated varistor usually has a large electrostatic capacity, which is the main reason that makes the signal quality deteriorate when a high-speed transmission system is used. In addition, an electrostatic protection device with a large electrostatic capacity cannot be used in an antenna circuit or a RF module. Thus, an electrostatic protection device with a low electrostatic capacity which is applicable to the high-speed transmission system needs to be developed.

It has been suggested that an electrostatic protection device with a low electrostatic capacity may has separate electrodes arranged oppositely and may use the composite (which is disposed between the electrodes) of the conductive inorganic materials and insulating inorganic materials as the discharge triggered part. Similar to the laminated varistor, such an electrostatic protection device is disposed between the static electricity entrance line and the ground. If a much too high voltage is applied, discharge will happen between the electrodes of the electrostatic protection device and then the static electricity will be led to the ground side.

The electrostatic protection device provided with gap typed electrodes has characteristics such as large insulation resistance, small electrostatic capacity and good responsiveness. On the other hand, a problem exists that short may occur because of the agglomeration of the electrodes and conductive inorganic materials inside the discharge triggered part due to the heat or stress generated during the discharging process.

In order to prevent short due to the discharging, for example, a technical solution has been provided as disclosed in Patent Document 1. Specifically, the electrostatic protection device disclosed in Patent Document 1 is characterized in that metal oxides such as the oxides of aluminium or magnesium are attached to the surfaces of the discharge electrodes in the gap typed discharge elements which have a pair of discharge electrodes at the hollow portion. With such a structure, the short between the oppositely arranged discharge electrodes can be inhibited since the oxides attached to the discharge electrodes have high insulation resistances. Also, the durability against repeated applying of static electricity can be improved.

PATENT DOCUMENT

Patent Document 1: JP2009-301819

SUMMARY

Even if the metal oxides disclosed in Patent Document 1 are attached to the discharge electrodes, the adhesion of the metal oxides to the discharge electrodes is not sufficient so that the durability with repeated use is not enough. In addition, as the oxides attached to the discharge electrodes may fall off the discharge electrodes due to the heat or stress generated upon discharging, the coverage of the discharge electrodes provided by the metal oxides is not sufficient, which results in the insufficiency of the durability with repeated use.

Based on these situations, the present invention aims to provide an electrostatic protection device with an excellent durability with repeated use.

To solve the technical problem mentioned above, the present invention provides an electrostatic protection device characterized in that a pair of discharge electrodes and a discharge triggered part are contained in a insulating laminate and a insulating layer containing a glass is disposed on part of the discharge electrodes.

After the performance evaluation of the electrostatic protection device with such a configuration, the inventors determine that the durability with repeated use is improved. The detail of the underlying mechanism of such an effect is predicted as follows.

Specifically, the electrostatic protection device with such a configuration mentioned above prevents the conductive inorganic materials in the discharge electrodes from flowing towards the discharge triggered part (which caused by the discharging process) by disposing insulating layer containing a glass on the surfaces of the pair of discharge electrodes formed in the insulating laminate. In addition, as the insulating layer contains a glass, the adhesion between the insulting layer and the discharge electrode is improved. Thus, the insulating layer is prevented from falling off or peeling off the discharge electrode, which is caused by the impact accompanied with the heat or stress generated upon discharging. Based on these results, it is predicted that the short between the discharge electrodes is inhibited in repeated uses, and the durability is improved.

To improve the durability with repeated use in the electrostatic protection device mentioned above, it is necessary to dispose the insulating layers on at least part of the pair of the discharge electrodes. In this way, the generation of melts between the discharge electrodes caused by the disruption around the discharge electrodes due to repeated discharges can be inhibited. Therefore, an electrostatic protection device can be obtained in which the short between the discharge electrodes is inhibited in repeated use and the durability with repeated use is excellent.

It is preferable that surfaces of both of the pair of discharge electrodes comprise the insulating layers containing glass.

With respect to the insulating layer containing glass, at least part of the connection portion between the pair of the discharge electrodes and the discharge triggered part contain the insulating layer(s). Further, it is preferable that all parts of the connection portion between the discharge electrodes and the discharge triggered part possess the insulating layer(s).

The component of the glass contained in insulating layer comprises at least one selected from the group consisting of $SiO_2$, $Al_2O_3$, $B_2O_3$, MgO, CaO, SrO, BaO, $Li_2O$, $Na_2O$, $K_2O$, ZnO and $ZrO_2$. Because the insulating layer containing the glass consisting of these oxides is excellent in insulativity, compactness and the adhesion to the discharge electrode, the material composing the insulating layer covering the discharge electrodes can effectively take effect. As a result, an electrostatic protection device with high performance and an excellent durability with repeated use can be obtained.

Furthermore, the glass contained in the insulating layer preferably includes at least one selected from the group consisting of the silicate glass, aluminosilicate glass, borate glass, borosilicate glass, sodalime glass, phosphate glass, plumbate glass and other inorganic acid salt glasses. Because the insulating layer containing these glass is excellent in insulativity, compactness and the adhesion to the discharge electrode, the material composing the insulating layer covering the discharge electrodes can effectively take effect. As a result, an electrostatic protection device with high performance and an excellent durability with repeated use can be obtained.

Further, the ratio of the glass contained in the insulating layer is preferably 10 wt % or more and 100 wt % or less. Because the insulating layer containing glass in such range is excellent in insulativity, compactness and the adhesion to the discharge electrode, the material composing the insulating layer covering the discharge electrodes can effectively take effect. As a result, an electrostatic protection device with high performance and an excellent durability with repeated use can be obtained.

If the insulating layer contains components other than the glass, in view of the insulativitity, these components can preferably be $Al_2O_3$, SrO, CaO, BaO, $TiO_2$, $SiO_2$, ZnO, $In_2O_3$, NiO, CoO, $SnO_2$, $V_2O_5$, CuO, MgO, $ZrO_2$, AlN and BN as the metal nitrides. In addition, the component can also be carbides such as SiC. These components can be used alone, or two or more of them can be used together.

In the present specification, the insulating layer may also contain a structure that is not compact. That is, the structure can be cancellous or macular. Further, the structure can be formed by the particles of insulating inorganic materials or the agglomeration of these particles, the properties of which are not particularly restricted.

According to the present invention, an electrostatic protection device with an improved durability with repeated use can be provided.

DETAILED DESCRIPTION OF EMBODIMENTS

Figure 1:
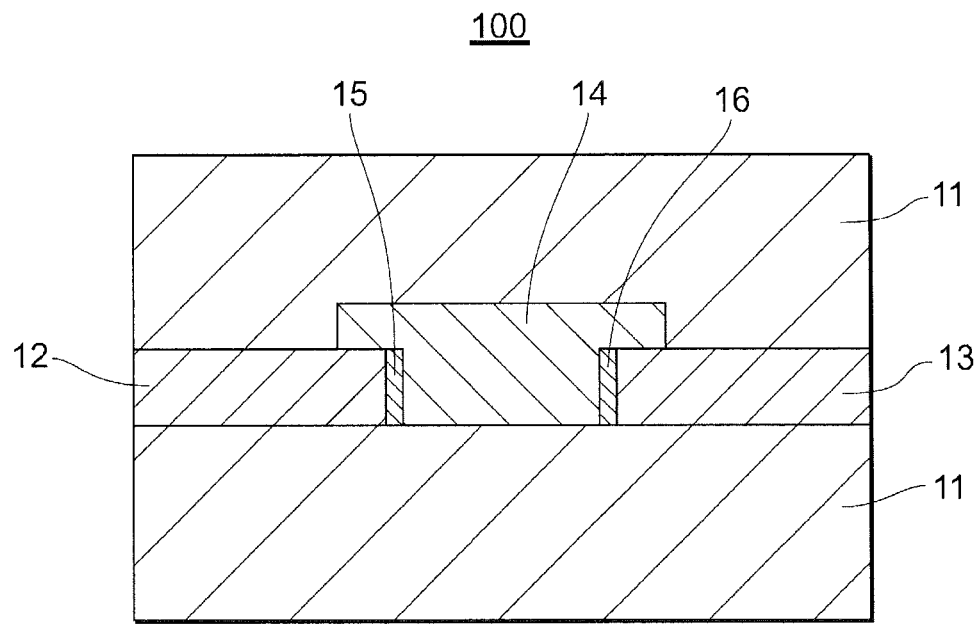
FIG. 1 is a sectional view schematically showing the electrostatic protection device 100 of Example 1.

Hereinafter, the embodiments of the present invention will be described. The same reference number is used for the same element, and the repeated descriptions will be omitted. The positional relationship is based on the drawings unless otherwise specified. In addition, the dimensional proportions are not limited to those shown in the drawings. Although the following embodiments are used to describe the present invention, the present invention is not limited to these embodiments.

FIG. 1 is a sectional view schematically showing the electrostatic protection device 100 of Example 1.

The electrostatic protection device 100 comprises an insulating laminate 11, a pair of rectangular discharge electrodes 12 and 13 disposed with a gap interval ΔG in the same plane of the insulating laminate 11, a discharge triggered part 14 arranged in the gap between the electrodes 12 and 13, the insulating layers 15 and 16 covering the surface of each electrode, which are respectively between the discharge electrode 12 or 13 and the discharge triggered part 14, and terminal electrodes (not shown) electrically connecting to the discharge electrodes 12 and 13. The electrostatic protection device 100 is prepared as a laminate in which the pair of discharge electrodes 12 and 13 is buried into the insulating laminate 11. In the electrostatic protection device 100, the discharge electrodes 12 and 13 electrically connect to the outside circuits via terminal electrodes. In this way, the electrostatic protection device 100 can function as protection materials against static electricity in which discharge is possible even when the discharge triggered part 14 is under a relatively low voltage. Specifically, when the overvoltage of the static electricity or the like is applied from the outside, the initial discharge can be ensured between the discharge electrodes 12 and 13 via the discharge triggered part 14.

The size and shape or the laminating count of the insulating laminate 11 are not particularly restricted as long as the insulating laminate 11 which become an insulating substrate can support at least the discharge electrodes 12 and 13 and the discharge triggered part 14. Here, besides the substrate composed of the insulating materials, the insulating laminate 11 further includes the substrate having an insulating film on part of its surfaces or all the surfaces. Alternatively, the substrate can be a conductive substrate with its surfaces covered by an insulating film.

The specific example of the insulating laminate 11 includes ceramics substrates which use materials with a low dielectric constant such as $Al_2O_3$, $SiO_2$, MgO, AlN, $Mg_2SiO_4$ (forsterite), the dielectric constants of which are 50 or lower, and preferably 20 or lower.

The pair of the discharge electrodes 12 and 13 is separately disposed on the insulating surfaces of the insulating laminate 11. In the present invention, discharge electrodes 12 and 13 are arranged with a gap interval ΔG in the insulating laminate 11. Here, the gap interval ΔG refers to the shortest distance between the discharge electrode 12 and the discharge electrode 13.

The materials for forming the discharge electrodes 12 and 13 are not particularly limited and can be at least one metal selected from the group consisting of C, Ni, Al, Fe, Cu, Ti, Cr, Au, Ag, Pd and Pt or the alloys thereof. In the present embodiment, the discharge electrodes 12 and 13 are formed in a rectangular shape when viewed from top. However, the shape is not particularly restricted and can be, for example, comb-like or serration-like.

There is no particular restriction on the gap interval ΔG between the discharge electrode 12 and the discharge electrode 13, and the gap interval can be appropriately set based on the desired discharging property. Usually, the gap interval is about 1 to 50 μm. In order to ensure the initial discharge under a low voltage, the gap interval is preferably about 5 to 40 μm, and more preferably 8 to 30 μm. In addition, the thickness for the discharge electrodes 12 and 13 is not particularly defined and can be properly set. Such a thickness is usually about 1 to 20 μm.

The method for forming the discharge electrodes 12 and 13 are not particularly restricted, and a well known method can be appropriately selected. Specifically, the method can be enumerate as the coating method, transfer printing, electroplating, electroless plating, vapor plating or sputtering and the like which form the discharge electrodes 12 and 13 with a desired thickness in the insulating laminate 11. In addition, the shape or gap interval ΔG of the discharge electrodes 12 and 13 can be processed by well-known methods such as ion milling, etching and laser processing. Also, the electrode layer can be formed on the substrate by the screen printing with the use of a plate for forming pattern on the gap portion between the two discharge electrodes 12 and 13. Thereafter, a firing process is provided so that the discharge electrodes 12 and 13 are formed. Alternatively, the element can be obtained by a laminating method in which the electrode layer can be formed via a screen printing process on the green sheet composed of insulators.

In the material that forms the insulating layers 15 and 16 which cover the discharge electrodes 12 and 13, silicate glass or aluminosilicate glass can be enumerate as glass. However, the glass is not limited thereto. In view of the insulativity, the component of the glass preferably contains at least one selected from the group consisting of $SiO_2$, $Al_2O_3$, $B_2O_3$, $MgO$, $CaO$, $SrO$, $BaO$, $Li_2O$, $Na_2O$, $K_2O$, $ZnO$ and $ZrO_2$. In addition, the glass preferably contains at least one selected from the group consisting of silicate glass, aluminosilicate glass, borate glass, borosilicate glass, sodalime glass, phosphate glass, plumbite glass and other inorganic acid salt glasses. These components can be used alone, or two or more of them can be used together.

As for the materials other than glasses for forming the insulating layers 15 and 16 which cover the discharge electrodes 12 and 13, $Al_2O_3$, $SrO$, $CaO$, $BaO$, $TiO_2$, $SiO_2$, $ZnO$, $In_2O_3$, $NiO$, $CoO$, $SnO_2$, $V_2O_5$, $CuO$, $MgO$, $ZrO_2$ are preferable metal oxides, and AlN and BN are preferable metal nitrides. In addition, the material can be carbides such as SiC. These materials can be used alone, or two or more of them can be used together.

In order to well reproduce the electrostatic protection devices 100 with an excellent durability with repeated use and an excellent discharging property, the resistance of the insulating inorganic materials contained in the insulating layers 15 and 16 is preferably $10^6$ Ωm or more.

The structure of the insulating layers 15 and 16 does not need to be compact, and the insulating layers are not necessarily layers or films. The structure can also be cancellous or macular. Further, the structure can be formed as the particles of the insulating inorganic materials or the agglomeration of these particles, the properties of which are not particularly restricted.

Further, the ratio of the glass in the insulating layers 15 and 16 is preferably 10 wt % or more and 100 wt % or less in the view of well reproducing the electrostatic protection device 100 with an excellent durability with repeated use and an excellent discharging property.

Also, it is preferable that both discharge electrodes have the insulating layers. Further, the whole boundary between the discharge electrodes 12,13 and the discharge triggered part 14 is preferably covered by the insulating layers 15 and 16.

Figure 2:
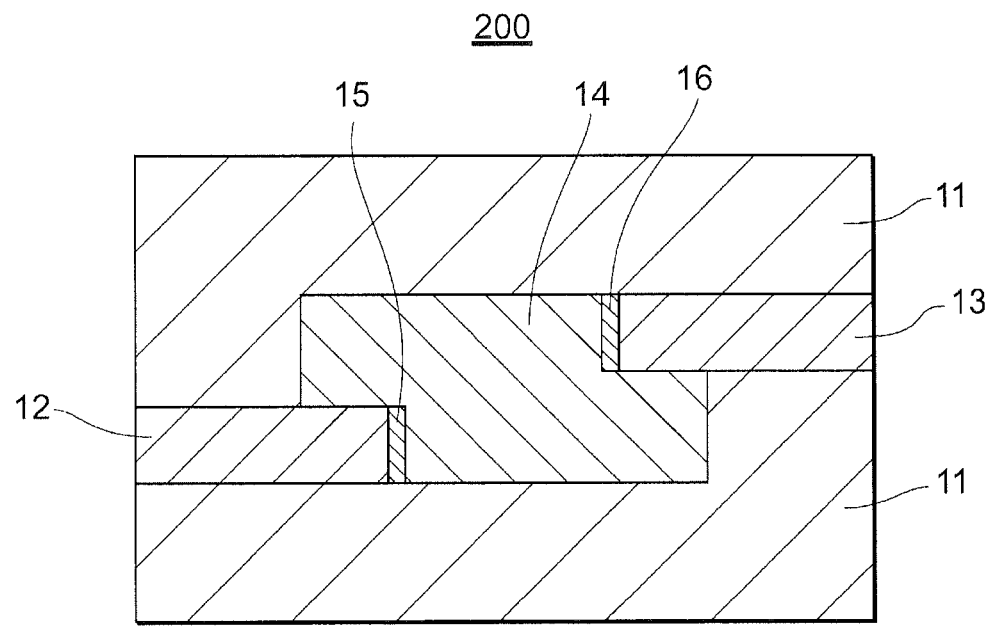
FIG. 2 is a sectional view schematically showing the electrostatic protection device 200 of Example 2.
Figure 3:
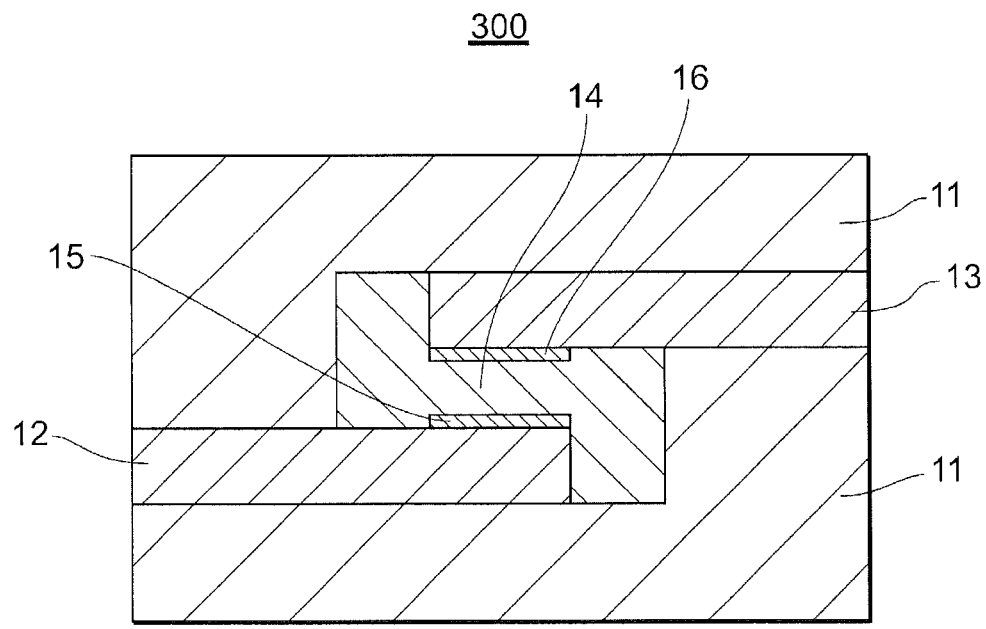
FIG. 3 is a sectional view schematically showing the electrostatic protection device 300 of Example 3.

The opposite arrangement (the positional relationship) of the pair of discharge electrodes 12 and 13 is not particularly restricted. With respect to the positional relationship, the two discharge electrodes can be disposed at the same plane in the insulating laminate, just as shown in FIG. 1. Also, as shown in FIGS. 2 and 3, the two discharge electrodes can exist on different planes in the insulating laminate.

The thicknesses of the insulating layers 15 and 16 respectively from the discharge electrodes 12 and 13 are preferably 0.01 μm or more and 10 μm or less in the view of well reproducing the electrostatic protection device 100 with an excellent durability with repeated use and an excellent discharging property.

The method for forming the insulating layers 15 and 16 is not particularly restricted, and a well-known method for film formation can be used. In order to well reproduce the discharge triggered part 14 with high performance in an easy way, the mixture containing insulating inorganic materials for forming the insulating layers are coated on the surfaces of the discharge electrodes, and then a firing process is processed. Such a method is preferable. Hereinafter, the preferable method for forming the insulating layers 15 and 16 is described.

In this method, a mixture at least containing the insulating inorganic materials is prepared. Then, in order to cover the surfaces of the discharge electrodes 12,13, the mixture is formed between the discharge electrodes 12,13 and the gap by coating or printing. After that, the mixture for the formation of insulating layers, which is formed at the gap portion is irradiated by the laser and then partly removed so that a desired thickness of the insulating layer can be obtained. In this way, the insulating layer which covers the electrode is obtained as well as a space for forming the discharge triggered part. Then, in the case of the electrostatic protection device 200 of Example 2 shown in FIG. 2, the discharge triggered part 14 is formed after the formation of the discharge electrode 12 and the insulating layer 15. Thereafter, the discharge electrode 13 and the insulating layer 16 are formed. Further, in the case of the electrostatic protection device 300 of Example 3 shown in FIG. 3, the discharge electrode 12 and the insulating layer 15 are formed in sequence, and then the discharge triggered part 14 is formed. Thereafter, the insulating layer 16 and the discharge electrode 13 are formed in sequence. During the preparation of the mixture or during the coating or printing process of the mixture, various additives such as a solvent or a binder can be added. Furthermore, the treatment conditions in the firing process are not particularly limited. However, in view of the production efficiency and the cost, the firing process is preferably performed under air atmosphere at a temperature of 500 to 1200° C. for about 10 minutes to 5 hours.

In the present embodiment, the discharge triggered part 14 consists of a composite with insulating inorganic materials and conductive inorganic materials dispersed therein. In addition, the discharge triggered part 14 may consist of holes or gaps, or consists of a composite with holes, gaps, insulating inorganic materials and conductive inorganic materials dispersed therein.

In the discharge triggered part composed of the conductive inorganic materials and insulating inorganic materials, the ratio of the conductive inorganic materials is preferably 20 vol % or more and 90 vol % or less. When the insulating layer containing glass is used to cover the discharge electrode, the ratio of the conductive inorganic materials contained in the discharge triggered part becomes more, and improved discharging property will be got. In the electrostatic protection device with such a composition, the connection between the discharge electrode and the conductive inorganic materials of the discharge triggered part can be inhibited during the firing process when forming the element by covering the discharge electrode with an insulating layer with a high compactness. In this way, the ratio of the conductive inorganic materials contained in the discharge triggered part can be elevated, and the discharging property can be improved.

The specific example of the conductive inorganic materials for forming the discharge triggered part can be, for example, metals, alloys, metal carbides, metal borides. However, the materials are not limited thereto. In view of the conductivity, C, Ni, Al, Fe, Cu, Ti, Cr, Au, Ag, Pd, and Pt or the alloys thereof are preferable.

The specific example of the insulating inorganic materials for forming the discharge triggered part can be, for example, metal oxides or metal nitrides such as AlN. However, the materials are not limited thereto. In view of the insulativity or the cost, $Al_2O_3$, SrO, CaO, BaO, $TiO_2$, $SiO_2$, ZnO, $In_2O_3$, NiO, CoO, $SnO_2$, $Bi_2O_3$, $Mg_2SiO_4$, $V_2O_5$, CuO, MgO, $ZrO_2$, $Mg_2SiO_4$, AlN, BN, SiC and the like are preferred. These materials can be used alone, or two or more of them can be used together. These insulating materials may form into films with uniformity or particle agglomeration without any restriction on their properties. In the view of high insulativity being provided, $Al_2O_3$, $SiO_2$, $Mg_2SiO_4$ and the like are preferably used.

The thickness of the discharge triggered part 14 is not particularly restricted and can be appropriately determined. Specifically, the thickness is preferably 10 nm to 60 µm, and more preferably 100 nm to 50 µm.

The method for forming the discharge triggered part 14 is not particularly restricted, and a well-known method for film formation can be used. In the view of well reproducing the discharge triggered part 14 with high performance in an easy way, it is suitable to use a method of coating the mixture containing at least the insulating inorganic materials and conductive inorganic materials and then firing. Hereinafter, the preferable method for forming the discharge triggered part 14 will be described.

The mixture at least containing insulating inorganic materials and conductive inorganic materials is prepared and then formed in the gap portion between the two discharge electrodes 12 and 13 by coating or printing process. Then, a firing process is provided. During the preparation of the mixture or during the coating or printing process of the mixture, various additives such as solvents or binders can be added. In addition, the treatment condition during the firing process is not particularly restricted. However, if the production efficiency and the cost are to be considered, the firing process is preferably performed under air atmosphere at a temperature of 500 to 1200° C. for 10 minutes to 5 hours.

The electrostatic protection device 100 of the present embodiment consists of a pair of discharge electrodes 12 and 13 and a discharge triggered part 14. Also, it has insulating layers 15 and 16 which cover the surfaces of the discharge electrodes. Thus, the connection between the discharge electrodes and the conductive inorganic materials of the discharge triggered part, which is caused by the melting, distortion or the like of the discharge electrodes and the discharge triggered part upon discharging, can be inhibited so that an electrostatic protection device with an excellent durability can be obtained in which the short will not occur.

Various modifications can be made to the present invention without departing from the spirit, and the present invention is not limited to the first embodiment described above.

EXAMPLES

Hereinafter, the present invention will be described with reference to the FIG. 1 to FIG. 6 which are the schematic views of the Examples and Comparative Examples of the embodiments.

First of all, the influence of the insulating layer and the kind of the insulating inorganic materials contained in the insulating layer on the durability against repeated discharges will be determined.

Example 1

First of all, the green sheet obtained by making the materials consisting of the main component $Al_2O_3$ and the glass component into a sheet was used as the insulating laminate 11. The Ag paste was printed with a thickness of 30 µm on one surface by screen printing so as to pattern and form a pair of discharge electrodes 12 and 13. The lengths of the discharge electrodes 12 and 13 was 0.6 mm and the width was 0.4 mm, and the gap interval ΔG between two electrodes 12 and 13 was 30 µm.

Next, the insulating layers 15 and 16 were formed on the insulating laminate 11 and the discharge electrodes 12 and 13 with the following orders. Firstly, the aluminosilicate glass with $Al_2O_3$, $SiO_2$ and SrO as the main components were used in the insulating inorganic materials. The ethyl cellulose resin as the binder and the terpineol as the solvent were mixed to prepare a lacquer with a solid-state concentration of 8 wt %. Then, the lacquer was added to the glass to prepare a paste of the insulating inorganic materials by mixing them. The obtained paste-like mixture was used to coat the surfaces of the insulating laminate 11 and the surfaces of the discharge electrodes 12 and 13 via screen printing. The middle portion of the gap between the electrodes was cut by the YAG laser to form the insulating layer, wherein the thickness of the insulating layer was 2 µm from the surface of the corresponding discharge electrode.

Thereafter, the discharge triggered part 14 was formed on the insulating laminate 11 and the discharge electrodes 12 and 13 in the following orders. Firstly, 70 vol % of glass particles (trade name: ME13, prepared by Nihon Yamamura Glass Co., Ltd.) with $SiO_2$ as the main component (which were the insulating inorganic materials) and 30 vol % of Ag particles (trade name: SPQ05S, prepared by Mitsui Kinzoku Co., Ltd) with an average particle size of 1 µm (which were the conductive inorganic materials) were measured and then mixed to get a mixture. Then, into the lacquer obtained by mixing the ethyl cellulose resins as the binder and the terpineol as the solvent with a solid ratio of 8 wt %, the mixture obtained above was added in order that the obtained mixture has a solid-state ratio of 60 vol %. The obtained mixture was mixed to prepare the paste for the discharge triggered part.

Then, the obtained paste-like mixture was coated via screen printing to fill the gap between the pair of discharge electrodes 12 and 13 so as to form the mixture layer (the precursor of the discharge triggered part 14). After a green sheet was laminated on the mixture layer, a hot pressing process was applied to prepare a laminate. Thereafter, the obtained laminate was cut into individual pieces with a specified size. The individual pieces of laminates were subjected to the thermal treatment at 200° C. for 1 hour (the process of removing the binder). Then, the temperature was raised with a rate of 10° C./min. The individual pieces of laminates were kept under air atmosphere at 950° C. for 30 minutes to obtain the fired articles. The gap interval ΔG between the pair of fired discharge electrodes 12 and 13 was 15 μm and the thickness was 20 μm. Further, the thickness for each of the insulating layers 15 and 16 was 1 μm from the surface of the corresponding discharge electrode.

After that, terminal electrodes with Ag as the main component were formed which were connected to the end portions at peripheral regions of the discharge electrodes 12 and 13. In this way, the electrostatic protection device 100 of Example 1 was obtained.

Example 2

The same substrate as Example 1 was used as the insulating laminate 11. The same pastes as Example 1 were respectively used as the Ag paste for forming the discharge electrodes 12 and 13, the paste of the insulating inorganic materials for forming the insulating layers 15 and 16 and the paste of the discharge triggered part for forming the discharge triggered part 14. As shown in FIG. 2, the discharge electrode 12, the insulating layer 15, the discharge triggered part 14, the insulating layer 16 and the discharge electrode 13 were formed in sequence by screen printing process on the insulating laminate 11. The thickness, length and width of the discharge electrodes were respectively 30 μm, 0.6 mm and 0.4 mm. The insulating layers 15 and 16 were formed on the surfaces of the discharge electrodes 12 and 13 and had a thickness of 2 μm from the surface of the corresponding discharge electrode and a width of 0.4 mm. A hot pressing process was applied after a green sheet was laminated on the insulating layers to prepare a laminate. Thereafter, the obtained laminate was cut into individual pieces with a specified size. Then, the individual pieces of laminates were subjected to the thermal treatment at 200° C. for 1 hour (the process of removing the binder). Then, the temperature was raised with a rate of 10° C./min. The individual pieces of laminates were kept under air atmosphere at 950° C. for 30 minutes to obtain the fired articles. The pair of fired discharge electrodes 12 and 13 had a thickness of 20 μm and a gap interval ΔG of 15 μm. Further, the thickness for each of the insulating layers 15 and 16 was 1 μm from the surface of the corresponding discharge electrode. Terminal electrodes were formed on the obtained fired article as in Example 1 to get the electrostatic protection device 200 of Example 2.

Example 3

The same substrate as Example 1 was used as the insulating laminate 11. The same pastes as Example 1 were respectively used as the Ag paste for forming the discharge electrodes 12 and 13, the paste of the insulating inorganic materials for forming the insulating layers 15 and 16 and the paste of the discharge triggered part for forming the discharge triggered part 14. As shown in FIG. 3, the discharge electrode 12, the insulating layer 15, the discharge triggered part 14, the insulating layer 16 and the discharge electrode 13 were formed in sequence by screen printing process on the insulating laminate 11. The thickness, length and width of the discharge electrodes were respectively 30 μm, 0.65 mm and 0.4 mm. The insulating layers 15 and 16 had a thickness of 2 μm from the surface of the corresponding discharge electrode and a width of 0.4 mm. A hot pressing process was applied after a green sheet was laminated on the insulating layers to prepare a laminate. Thereafter, the obtained laminate was cut into individual pieces with a specified size. Then, the individual pieces of laminates were subjected to the thermal treatment at 200° C. for 1 hour (the process of removing the binder). Then, the temperature was raised with a rate of 10° C./min. The individual pieces of laminates were kept under air atmosphere at 950° C. for 30 minutes to obtain the fired articles. The pair of fired discharge electrodes 12 and 13 had a gap interval ΔG of 15 μm and a thickness of 20 μm. Further, the thickness for each of the insulating layers 15 and 16 was 1 μm from the surface of the corresponding discharge electrode. Terminal electrodes were formed on the obtained fired article as in Example 1 to get the electrostatic protection device 300 of Example 3.

Example 4

Figure 4:
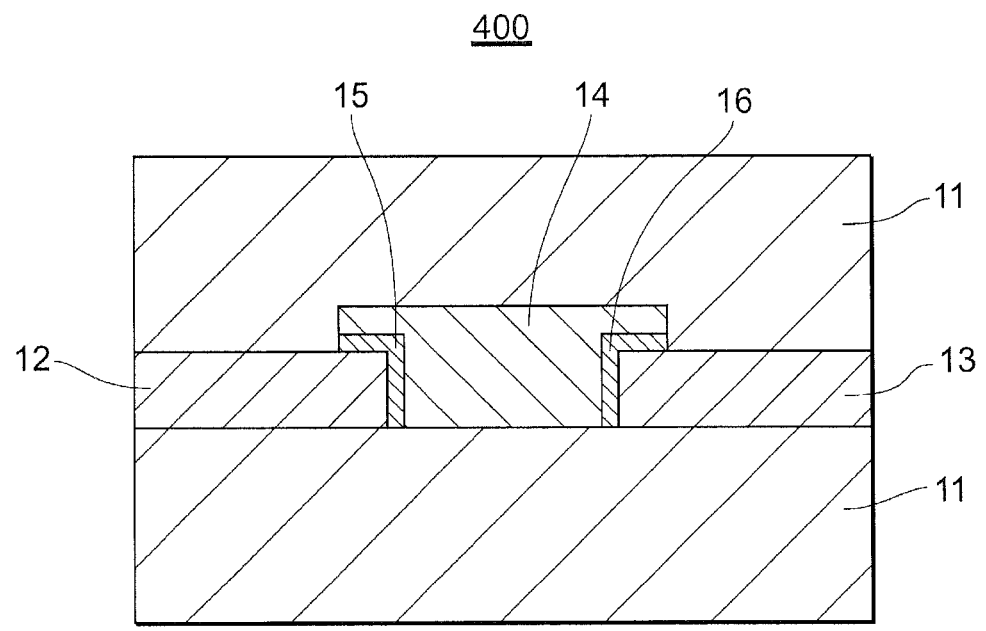
FIG. 4 is a sectional view schematically showing the electrostatic protection device 400 of Example 4.

To avoid the direct contact between the discharge electrodes and the discharge triggered part, the paste for the insulating layer used in Example 1 was coated on the discharge electrodes by screen printing after the formation of the insulating layers on both discharge electrodes. The other processes were the same as in Example 1, and an electrostatic protection device 400 was obtained as shown in FIG. 4.

Example 5

Figure 5:
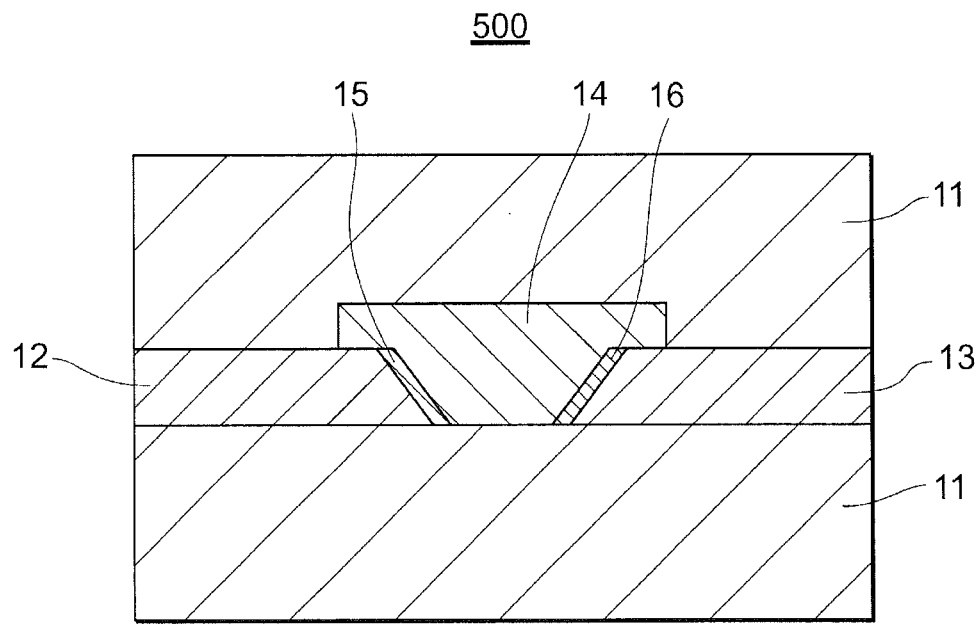
FIG. 5 is a sectional view schematically showing the electrostatic protection device 500 of Example 5.

An electrostatic protection device 500 shown in FIG. 5 was obtained as Example 1 except that the discharge electrodes were processed by the laser to have inclines.

Example 6

An electrostatic protection device 100 shown in FIG. 1 was obtained as in Example 1 except that the insulating inorganic materials used for the insulating layers 15 and 16 was changed from aluminosilicate glass with $Al_2O_3$, $SiO_2$ and SrO as the main components to borosilicate glass with $B_2O_3$, $SiO_2$ and SrO as the main components.

Example 7

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components borosilicate glass with $B_2O_3$, $SiO_2$ and BaO as the main components.

Example 8

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to borosilicate glass with $B_2O_3$, $SiO_2$ and ZnO as the main components.

Example 9

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to aluminosilicate glass with $Al_2O_3$, $SiO_2$ and BaO as the main components.

Example 10

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to aluminosilicate glass with $Al_2O_3$, $SiO_2$ and ZnO as the main components.

Example 11

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to aluminosilicate glass with $Al_2O_3$, $SiO_2$ and MgO as the main components.

Example 12

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to borosilicate glass with $B_2O_3$, $SiO_2$ and $Li_2O$ as the main components.

Example 13

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to borosilicate glass with $B_2O_3$, $SiO_2$ and $K_2O$ as the main components.

Example 14

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to borosilicate glass with $B_2O_3$, $SiO_2$ and $Na_2O$ as the main components.

Example 15

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to borosilicate glass with $B_2O_3$, $SiO_2$ and CaO as the main components.

Example 16

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to sodalime glass with CaO, $SiO_2$ and $Na_2O$, as the main components.

Example 17

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to sodalime glass with CaO, $SiO_2$ and $K_2O$, as the main components.

Comparative Example 1

Figure 6:
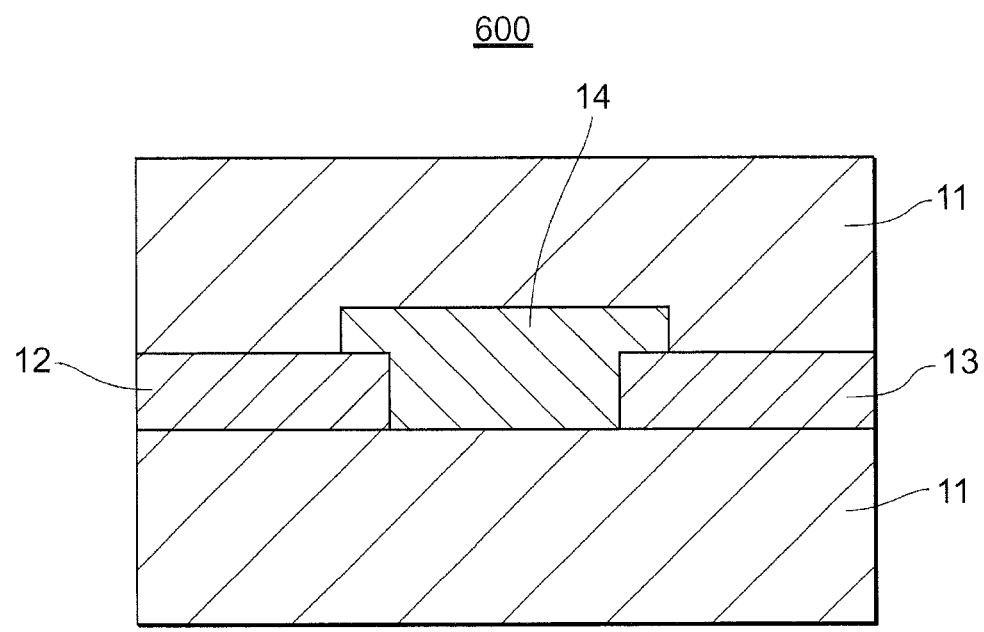
FIG. 6 is a sectional view schematically showing the electrostatic protection device 600 of Comparative Example 1.

An electrostatic protection device 600 as shown in FIG. 6 was obtained as in Example 1 except that the insulating layers were not formed.

Comparative Example 2

An electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to $Al_2O_3$.

Comparative Example 3

The electrostatic protection device 100 shown in FIG. 1 was obtained as in Example 1 except that the insulating inorganic materials used for the insulating layers 15 and 16 were changed from aluminosilicate glass with $Al_2O_3$, $SiO_2$ and SrO as the main components to MgO.

<Electrostatic Discharge Test>

Figure 7:
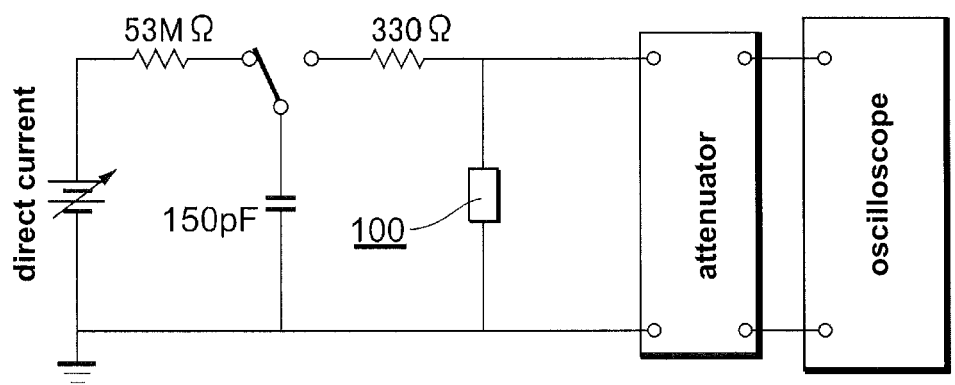
FIG. 7 shows the circuit diagram in the electrostatic discharge test.

The electrostatic discharge test was performed for the electrostatic protection devices of Examples 1 to 17 and Comparative Examples 1 to 3 by using the circuit shown in FIG. 7. The results were shown in Table 1.

The electrostatic discharge test was performed following the human body model (discharge resistance was 330Ω, discharge capacity was 150 pF, applied voltage was 8 kV, contact discharge) based on the IEC61000-4-2 electrostatic discharge immunity test and the noise test. Specifically, as shown in the circuit for electrostatic test in FIG. 7, one terminal electrode of the electrostatic protection device as the evaluation subject was connected to the ground and the other terminal electrode was connected to the electrostatic pulse applying portion so that the electrostatic pulses were applied when the electrostatic pulse applying portion contacted the discharge gun. In the electrostatic discharge test, 100 items were prepared for each sample, and the electrostatic discharge test was repeated for 100 times with a voltage of 8.0 kV. The discharging property was evaluated as the peak value during the first discharge test. Further, the numbers of occurrence of the short between the discharge electrodes were counted after 100 repeated tests, and the numbers of occurrence was used to evaluate the durability against repeated discharges.

TABLE 1

| | Comparative Example 1* | Comparative Example 2* | Comparative Example 3* | Example 1 | Example 2 | Example 3 |
|---|---|---|---|---|---|---|
| Type of insulator | none | $Al_2O_3$ | MgO | $SiO_2$—$Al_2O_3$—SrO glass | $SiO_2$—$Al_2O_3$—SrO glass | $SiO_2$—$Al_2O_3$—SrO glass |
| Thickness of insulating layer [μm] | — | 1 | 1 | 1 | 1 | 1 |
| Interval between electrodes ΔG [μm] | 15 | 15 | 15 | 15 | 15 | 15 |
| Ratio of conductive inorganic materials in discharge triggered part [vol %] | 30 | 30 | 30 | 30 | 30 | 30 |
| Ratio of short in repeated tests | 92/100 | 63/100 | 55/100 | 9/100 | 16/100 | 22/100 |
| Evaluation | X | Δ | Δ | ◎ | ○ | ○ |

| | Example 4 | Example 5 | Example 6 | Example 7 | Example 8 |
|---|---|---|---|---|---|
| Type of insulator | $SiO_2$—$Al_2O_3$—SrO glass | $SiO_2$—$Al_2O_3$—SrO glass | $SiO_2$—$Al_2O_3$—SrO glass | $B_2O_3$—$SiO_2$—BaO glass | $B_2O_3$—$SiO_2$—ZnO glass |
| Thickness of insulating layer [μm] | 1 | 1 | 1 | 1 | 1 |
| Interval between electrodes ΔG [μm] | 15 | 15 | 15 | 15 | 15 |
| Ratio of conductive inorganic materials in discharge triggered part [vol %] | 30 | 30 | 30 | 30 | 30 |
| Ratio of short in repeated tests | 3/100 | 11/100 | 18/100 | 22/100 | 28/100 |
| Evaluation | ◎ | ◎ | ○ | ○ | ○ |

| | Example 9 | Example 10 | Example 11 | Example 12 | Example 13 |
|---|---|---|---|---|---|
| Type of insulator | $SiO_2$—$Al_2O_3$—BaO glass | $SiO_2$—$Al_2O_3$—ZnO glass | $SiO_2$—$Al_2O_3$—MgO glass | $B_2O_3$—$SiO_2$—$Li_2O$ glass | $B_2O_3$—$SiO_2$—$K_2O$ glass |
| Thickness of insulating layer [μm] | 1 | 1 | 1 | 1 | 1 |
| Interval between electrodes ΔG [μm] | 15 | 15 | 15 | 15 | 15 |
| Ratio of conductive inorganic materials in discharge triggered part [vol %] | 30 | 30 | 30 | 30 | 30 |
| Ratio of short in repeated tests | 7/100 | 10/100 | 13/100 | 40/100 | 32/100 |
| Evaluation | ◎ | ◎ | ◎ | ○ | ○ |

| | Example 14 | Example 15 | Example 16 | Example 17 |
|---|---|---|---|---|
| Type of insulator | $B_2O_3$—$SiO_2$—$Na_2O$ glass | $B_2O_3$—$SiO_2$—CaO glass | CaO—$SiO_2$—$Na_2O$ glass | CaO—$SiO_2$—$K_2O$ glass |
| Thickness of insulating layer [μm] | 1 | 1 | 1 | 1 |
| Interval between electrodes ΔG [μm] | 15 | 15 | 15 | 15 |
| Ratio of conductive inorganic materials in discharge triggered part [vol %] | 30 | 30 | 30 | 30 |
| Ratio of short in repeated tests | 34/100 | 31/100 | 36/100 | 39/100 |
| Evaluation | ○ | ○ | ○ | ○ |

*beyond the scope of claims

It can be known from Table 1 that the occurrence of short between discharge electrodes was evidently inhibited for the electrostatic protection devices of Examples 1 to 17. Also, they had an improved durability with repeated use and an excellent reliability. Further, it can be determined from Examples 1 to 5 that no matter what the positional relationship was for the discharge electrodes, an element with an excellent durability with repeated use can be obtained by forming an insulating layer containing a glass. The durability with repeated use can be even better if the insulating layer was arranged on the whole connection portion between the discharge electrodes 12 and 13 and the discharge triggered part 14, as shown the electrostatic protection device 300 of Example 3 in Example 4. In addition, it can be known from Examples 6 to 17 that an element with an excellent durability with repeated use can be obtained no matter what kind of glasses were contained in the insulating layer.

In another respect, it can be known from Table 1 that the short occurred for many times between the discharge electrodes and the durability with repeated use deteriorated in the electrostatic protection device of Comparative Example 1. Thus, if no insulating layer was present between the discharge electrode and the discharge triggered part, the destroy to the discharge electrodes and the discharge triggered part was easily to happen due to the heat or stress generated upon discharging, i.e., the short between the discharge electrodes was likely to happen.

Furthermore, in the electrostatic protection devices of Comparative Examples 2 to 3, the short between the discharge electrodes happened a lot and the durability with repeated use deteriorated. The reason might be as follows. The insulating layer which covered the discharge electrodes did not contain a glass, so the coverage as well as adhesion was not sufficient. As the insulating layer might fall off the discharge electrode due to the discharging process, conductive paths were generated between the discharge electrode and the conductive inorganic materials of the discharge triggered part so that the short would happen.

Hereinafter, the differences about the ratio of the short in the discharge durability tests, the peak voltage and the ratio of short in preliminary stage were determined when the ratio of conductive inorganic materials contained in the discharge triggered part was changed.

Example 18

An electrostatic protection device 100 shown in FIG. 1 was obtained as in Example 1 except that 80 vol % of glass particles (trade name: ME13, produced by Nihon Yamamura Glass Co., Ltd.) with $SiO_2$ as the main component (which were the insulating inorganic materials) and 20 vol % of Ag particles (trade name: SPQ05S, produced by Mitsui Kinzoku Co., Ltd) with an average particle size of 1 μm (which were the conductive inorganic materials) were used to replace the materials used for the discharge triggered part 14.

Example 19

The electrostatic protection device 100 shown in FIG. 1 was obtained as in Example 1 except that 50% of glass particles (trade name: ME13, prepared by Nihon Yamamura Glass Co., Ltd.) with $SiO_2$ as the main component (which were the insulating inorganic materials) and 50 vol % of Ag particles (trade name: SPQ05S, prepared by Mitsui Kinzoku Co., Ltd) with an average particle size of 1 μm (which were the conductive inorganic materials) were used to replace the materials used for the discharge triggered part 14.

Example 20

The electrostatic protection device 100 shown in FIG. 1 was obtained as in Example 1 except that 30 vol % of glass particles (trade name: ME13, produced by Nihon Yamamura Glass Co., Ltd.) with $SiO_2$ as the main component (which were the insulating inorganic materials) and 70 vol % of Ag particles (trade name: SPQ05S, produced by Mitsui Kinzoku Co., Ltd) with an average particle size of 1 μm (which were the conductive inorganic materials) were used to replace the materials used for the discharge triggered part 14.

Example 21

The electrostatic protection device 100 shown in FIG. 1 was obtained as in Example 1 except that 10 vol % of glass particles (trade name: ME13, produced by Nihon Yamamura Glass Co., Ltd.) with $SiO_2$ as the main component (which were the insulating inorganic materials) and 90 vol % of Ag particles (trade name: SPQ05S, produced by Mitsui Kinzoku Co., Ltd) with an average particle size of 1 μm (which were the conductive inorganic materials) were used to replace the materials used for the discharge triggered part 14.

Example 22

The electrostatic protection device 100 shown in FIG. 1 was obtained as in Example 1 except that 90 vol % of glass particles (trade name: ME13, produced by Nihon Yamamura Glass Co., Ltd.) with $SiO_2$ as the main component (which were the insulating inorganic materials) and 10 vol % of Ag particles (trade name: SPQ05S, produced by Mitsui Kinzoku Co., Ltd) with an average particle size of 1 μm (which were the conductive inorganic materials) were used to replace the materials used for the discharge triggered part 14.

Example 23

The electrostatic protection device 100 shown in FIG. 1 was obtained as in Example 1 except that 5 vol % of glass particles (trade name: ME13, produced by Nihon Yamamura Glass Co., Ltd.) with $SiO_2$ as the main component (which were the insulating inorganic materials) and 95 vol % of Ag particles (trade name: SPQ05S, produced by Mitsui Kinzoku Co., Ltd) with an average particle size of 1 μm (which were the conductive inorganic materials) were used to replace the materials used for the discharge triggered part 14.

<Electrostatic Discharge Test>

The same electrostatic discharge test as for Examples 1 to 6 was applied to the electrostatic protection devices obtained in Example 1 and 18 to 23.

TABLE 2

|  | Example 1 | Example 18 | Example 19 | Example 20 |
|---|---|---|---|---|
| Type of insulator | $SiO_2$—$Al_2O_3$—SrO glass | $SiO_2$—$Al_2O_3$—SrO glass | $SiO_2$—$Al_2O_3$—SrO glass | $SiO_2$—$Al_2O_3$—SrO glass |
| Thickness of insulating layer [μm] | 1 | 1 | 1 | 1 |
| Interval between electrodes ΔG [μm] | 15 | 15 | 15 | 15 |
| Ratio of conductive inorganic materials in discharge triggered part [vol %] | 30 | 20 | 50 | 70 |
| Ratio of short in preliminary stage | 0/100 | 0/100 | 2/100 | 10/100 |
| Evaluation | ☺ | ☺ | ☺ | ☺ |
| Ratio of short in repeated tests | 9/100 | 0/100 | 9/100 | 19/100 |
| Evaluation | ☺ | ☺ | ☺ | ☺ |
| Peak voltage [V] | 520 | 690 | 410 | 330 |
| Evaluation | ○ | ○ | ☺ | ☺ |

TABLE 2-continued

|  | Example 21 | Example 22 | Example 23 |
|---|---|---|---|
| Type of insulator | $SiO_2$—$Al_2O_3$—SrO glass | $SiO_2$—$Al_2O_3$—SrO glass | $SiO_2$—$Al_2O_3$—SrO glass |
| Thickness of insulating layer [μm] | 1 | 1 | 1 |
| Interval between electrodes ΔG [μm] | 15 | 15 | 15 |
| Ratio of conductive inorganic materials in discharge triggered part [vol %] | 90 | 10 | 95 |
| Ratio of short in preliminary stage | 22/100 | 0/100 | 49/100 |
| Evaluation | ○ | ◎ | Δ |
| Ratio of short in repeated tests | 31/100 | 0/100 | 63/100 |
| Evaluation | ○ | ◎ | Δ |
| Peak voltage [V] | 200 | 850 | 140 |
| Evaluation | ◎ | Δ | ◎ |

It can be seen from Table 2 that the ratio of conductive inorganic materials in the discharge triggered part 14 was increased by disposing the insulating layers 15 and 16 containing glass at the discharge electrodes 12 and 13 in the electrostatic protection devices of Example 1 and 18 to 23. Thus, these electrostatic protection devices had an excellent durability with repeated use, a low peak voltage and an excellent discharging property.

In another respect, it can be known from Table 2 that the durability with repeated use was quite good for the electrostatic protection device of Example 22. On the other hand, the peak voltage was larger than those in Examples 1 and 18 to 21, and the discharging property deteriorated. Further, as the electrostatic protection device of Example 23 had a higher ratio of the conductive inorganic materials, the peak voltage was good but the short between the fired electrodes happened a lot. Even short would not happen after the firing process, the durability with repeated use deteriorated.

As described above, the electrostatic protection device of the present invention had an improved discharging property and durability with repeated use, and can improve the discharging property. Thus, it can be widely and effectively used in electric or electrical devices having electrostatic protection devices and various machines, equipments and systems containing these electric or electrical devices.

DESCRIPTION OF REFERENCE NUMERALS

11 insulating laminate
12, 13 discharge electrode
14 discharge triggered part
15, 16 insulating layer
100, 200, 300, 400, 500, 600 electrostatic protection device

What is claimed is:

1. An electrostatic protection device, wherein, the electrostatic protection device comprises a pair of discharge electrodes and a discharge triggered part inside an insulating laminate, and an insulating layer containing glass is disposed on at least part of the discharge electrodes, wherein,
the discharge triggered part is disposed between the pair of discharge electrodes and at the periphery of the end portions of the discharge electrodes, wherein,
at least the connection portion between the pair of the discharge electrodes and the discharge triggered part contain the insulating layer, and wherein,
the insulating layer has a thickness of 0.01 μm or more and 10 μm or less.

2. The electrostatic protection device of claim 1, wherein, the surfaces of both of the pair of discharge electrodes contain the insulating layer containing glass.

3. The electrostatic protection device of claim 1, wherein, the glass contains at least one selected from the group consisting of $SiO_2$, $Al_2O_3$, $B_2O_3$, MgO, CaO, SrO, BaO, $Li_2O$, $Na_2O$, $K_2O$, ZnO and $ZrO_2$ as its component.

4. The electrostatic protection device of claim 1, wherein, the glass contains at least one selected from the group consisting of silicate glass, aluminosilicate glass, borate glass, borosilicate glass, sodalime glass, phosphate glass, plumbate glass and other inorganic acid salt glasses.

5. The electrostatic protection device of claim 1, wherein, the pair of discharge electrodes have a gap interval (ΔG) of 1 to 50 μm.

6. The electrostatic protection device of claim 5, wherein, ΔG is 5 to 40 μm.

7. The electrostatic protection device of claim 5, wherein, ΔG is 8 to 30 μm.

8. The electrostatic protection device of claim 1, wherein, the discharge triggered part is a composite comprising insulating inorganic materials and conductive inorganic materials dispersed therein.

9. The electrostatic protection device of claim 8, wherein, the discharge triggered part contains holes or gaps.

10. The electrostatic protection device of claim 8, wherein, the conductive inorganic materials are present in a ratio of 20-90 vol % of the discharge triggered part.

11. The electrostatic protection device of claim 1, wherein, the discharge triggered part contains holes or gaps.

12. The electrostatic protection device of claim 1, wherein, the discharge triggered part has a thickness of 10 nm to 60 μm.

13. The electrostatic protection device of claim 1, wherein, the discharge triggered part has a thickness of 100 nm to 50 μm.

14. An electrostatic protection device, wherein, the electrostatic protection device comprises a pair of discharge electrodes and a discharge triggered part inside an insulating laminate, and an insulating layer containing glass is disposed on at least part of the discharge electrodes, wherein,
the discharge triggered part is disposed between the pair of discharge electrodes and at the periphery of the end portions of the discharge electrodes, wherein,
at least the connection portion between the pair of the discharge electrodes and the discharge triggered part contain the insulating layer, and wherein, the discharge triggered part has a thickness of 10 nm to 60 µm.

15. The electrostatic protection device of claim 14, wherein, the discharge triggered part has a thickness of 100 nm to 50 µm.

* * * * *